United States Patent
Sherpa et al.

(10) Patent No.: US 10,446,407 B2
(45) Date of Patent: *Oct. 15, 2019

(54) METHOD OF PREFERENTIAL SILICON NITRIDE ETCHING USING SULFUR HEXAFLUORIDE

(71) Applicant: Tokyo Electron Limited, Minato-ku, Tokyo (JP)

(72) Inventors: Sonam D. Sherpa, Albany, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/874,703

(22) Filed: Jan. 18, 2018

(65) Prior Publication Data
US 2018/0204733 A1    Jul. 19, 2018

Related U.S. Application Data

(60) Provisional application No. 62/447,769, filed on Jan. 18, 2017.

(51) Int. Cl.
*H01L 21/311* (2006.01)
*H01L 21/67* (2006.01)
*H01J 37/32* (2006.01)

(52) U.S. Cl.
CPC .... *H01L 21/31116* (2013.01); *H01J 37/3244* (2013.01); *H01L 21/67069* (2013.01); *H01J 37/32091* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 4,956,314 A | * | 9/1990 | Tam | H01L 21/28587 257/E21.248 |
| 5,387,312 A | * | 2/1995 | Keller | H01L 21/31116 257/E21.252 |
| 6,277,700 B1 | * | 8/2001 | Yu | H01L 21/31116 257/E21.252 |
| 2006/0216938 A1 | | 9/2006 | Miyagawa et al. | |
| 2006/0281266 A1 | | 12/2006 | Wells | |

(Continued)

OTHER PUBLICATIONS

Korean Intellectual Property Office (KIPO), International Search Report and Written Opinion for international application No. PCT/US2018/014266, dated May 9, 2018, 12 pages.

*Primary Examiner* — Shamim Ahmed

(57) ABSTRACT

Embodiments of the invention describe substrate processing methods using non-polymerizing chemistry to preferentially etch silicon nitride relative to other materials found in semiconductor manufacturing. According to one embodiment, a processing method includes providing in a plasma processing chamber a substrate containing a first material containing silicon nitride and a second material that is different from the first material, forming a plasma-excited process gas containing $SF_6$, and exposing the substrate to the plasma-excited process gas to preferentially etch the first material relative to the second material. In one example, the process gas can contain or consist of $SF_6$ and Ar. In another example, the second material is selected from the group consisting of Si and $SiO_2$.

14 Claims, 5 Drawing Sheets

(56) References Cited

U.S. PATENT DOCUMENTS

| | | |
|---|---|---|
| 2009/0163030 A1 | 6/2009 | Omura et al. |
| 2012/0238102 A1* | 9/2012 | Zhang ............... H01J 37/32422 438/718 |
| 2013/0164940 A1 | 6/2013 | Raley et al. |
| 2015/0214067 A1 | 7/2015 | Zhang et al. |
| 2017/0345674 A1* | 11/2017 | Ranjan ............. H01L 21/31116 |

* cited by examiner

METHOD OF PREFERENTIAL SILICON NITRIDE ETCHING USING SULFUR HEXAFLUORIDE

CROSS-REFERENCE TO RELATED APPLICATIONS

This application is related to and claims priority to U.S. Provisional Patent Application Ser. No. 62/447,769 filed on Jan. 18, 2017, the entire contents of which are herein incorporated by reference.

FIELD OF INVENTION

The present invention relates to the field of semiconductor manufacturing and semiconductor devices, and more particularly, to a method of preferential silicon nitride etching relative to other materials used in semiconductor manufacturing.

BACKGROUND OF THE INVENTION

Next generation semiconductor technology development poses a huge challenge as dry etch removal of silicon nitride (SiN) selective to silicon oxide ($SiO_2$) and other materials is needed. Current fluorocarbon chemistry used for SiN etch becomes extremely difficult to control at narrow mask openings and high aspect ratio due to possibility of clogging of recessed features and the process margin diminishes with each subsequent technology node. Hence the need for a new chemistry approaches that are free from fluorocarbon deposition and bypasses additional challenges of existing processes.

SUMMARY OF THE INVENTION

Embodiments of the invention describe substrate processing methods using non-polymerizing chemistry to preferentially etch silicon nitride relative to other materials used in semiconductor manufacturing.

According to one embodiment, the method includes providing a substrate containing a first material containing silicon nitride and a second material that is different from the first material, forming a plasma-excited process gas containing sulfur hexafluoride ($SF_6$), and exposing the substrate to the plasma-excited process gas to preferentially etch the first material relative to the second material. In one example, the second material may be selected from the group consisting of Si and $SiO_2$. In one example, the process gas may consist of $SF_6$ and Ar.

According to one embodiment, the method includes providing in a plasma processing chamber a substrate containing a first material containing SiN and a second material selected from the group consisting of Si and $SiO_2$, forming a plasma-excited process gas containing $SF_6$ and Ar, and exposing the substrate to the plasma-excited process gas to preferentially etch the first material relative to the second material.

According to one embodiment, the method includes providing in a plasma processing chamber a substrate containing a first material containing SiN and a second material containing $SiO_2$, forming a plasma-excited process gas containing $SF_6$ and Ar, and exposing the substrate to the plasma-excited process gas to preferentially etch the first material relative to the second material with a $SiN/SiO_2$ etch selectivity greater than 30, where the exposing includes exposing the substrate to ions with kinetic energy that is below a sputtering threshold of the first and second materials.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Embodiments of the invention describe substrate processing methods using non-polymerizing chemistry to preferentially etch silicon nitride with high etch selectivity relative to other materials. In one example, $SiN/SiO_2$ etch selectivity greater than 30 can be achieved.

Figure 1A:
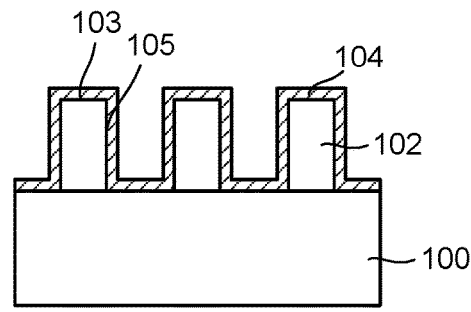
FIGS. 1A-1C schematically show through cross-sectional views a method of processing a substrate according to an embodiment of the invention.
Figure 1B:
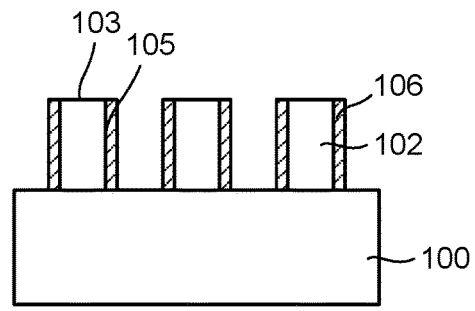
Figure 1C:
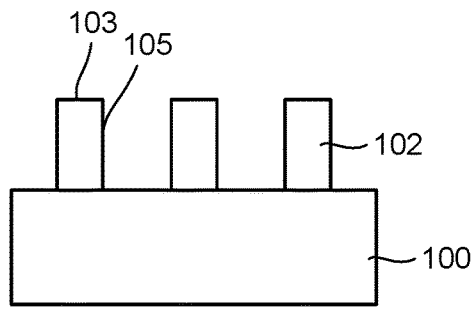
Figure 6:
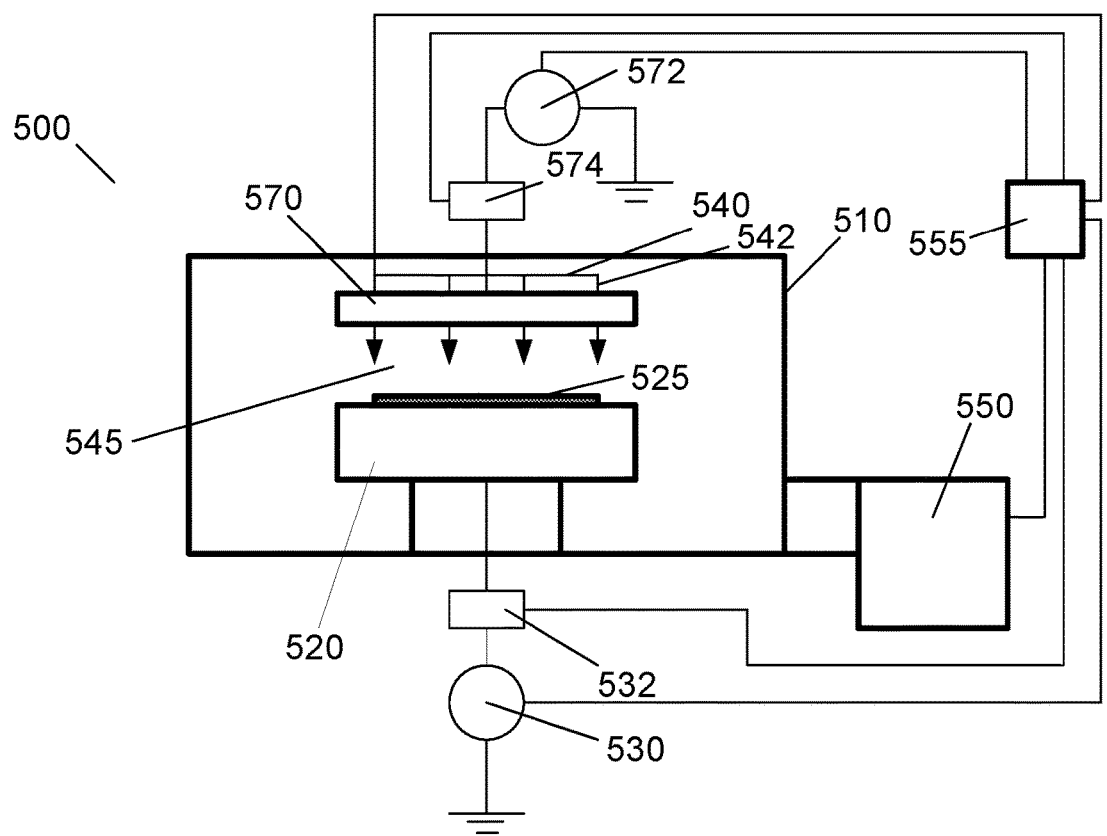
FIG. 6 schematically shows a capacitively coupled plasma (CCP) system according to an embodiment of the invention.

FIGS. 1A-1C schematically show through cross-sectional views a method of processing a substrate according to an embodiment of the invention. FIG. 1A shows a substrate 100, raised features 102 on the substrate 100, and a SiN spacer layer 104 conformally deposited on the exposed surfaces of the raised features 102 and the substrate 100. In this embodiment, the SiN spacer layer 104 is referred to as a first material, and the raised features 102 are referred to as a second material. The exposed surfaces of the raised features 102 include vertical portions 105 and horizontal portions 103. The substrate 100 and the raised features 102 can, for example, contain or consist of Si or $SiO_2$. In one example, the substrate 100 consists of Si and the raised features 102 consist of $SiO_2$. In some examples of microelectronic devices, the raised features 102 are referred to as fins. As used herein, the notation "SiN" includes material layers that contain silicon and nitrogen as the major constituents, where the layers can have a range of Si and N compositions. $Si_3N_4$ is the most thermodynamically stable of the silicon nitrides and hence the most commercially important of the silicon nitrides. However, embodiments of the invention may be applied to SiN material layers having a wide range of Si and N compositions. An ALD system that may be used for depositing the SiN spacer layer 104 is schematically shown in FIG. 6.

A spacer etch process may be performed on the structure shown in FIG. 1A to form the structure shown in FIG. 1B. The spacer etch process may use fluorocarbon chemistry (e.g., $C_4F_6$ or $CH_3F$) to form SiN sidewall spacers 106 on the vertical portions 105 of the raised features 102 by anisotropically removing the SiN spacer layer 104 from the horizontal portions 103 of while leaving the SiN spacer layer 104 on the vertical portions 105. Following the formation of the SiN sidewall spacers 106, an anisotropic etching process may be performed to etch recessed features (not shown) in the exposed substrate 100 using the raised features 102 and the SiN sidewall spacers 106 as a mask.

According to one embodiment, the SiN sidewall spacers 106 are removed from the vertical portions 105 of the raised features 102 in a dry etch process using a non-polymerizing process gas. The inventors have discovered that the non-polymerizing process gas provides excellent preferential dry etching removal of SiN relative to $SiO_2$ and other materials. This is in contrast to currently existing fluorocarbon chemistry used for SiN etching which is extremely difficult to control at narrow feature openings and high aspect ratio features due to polymer deposition flux from the fluorocarbon chemistry. The resulting structure is shown in FIG. 1C. The removal of the SiN sidewall spacers 106 may be performed by plasma-exciting a non-polymerizing process gas containing $SF_6$ and optionally Ar, and exposing the substrate 100 to the plasma-excited process gas. In some examples, the non-polymerizing process gas contains or consists of $SF_6$ and Ar.

The non-polymerizing process gas may be plasma-excited using a variety of different plasma sources. According to one embodiment, the plasma source can include a capacitively coupled plasma (CCP) source that contains an upper plate electrode, and a lower plate electrode supporting the substrate. Radio frequency (RF) power may be provided to the upper plate electrode, the lower plate electrode, or both, using RF generators and impedance networks. A typical frequency for the application of RF power to the upper plate electrode ranges from 10 MHz to 200 MHz and may be 60 MHz. In some examples, the upper plate electrode may be grounded or not powered. Additionally, a typical frequency for the application of RF power to the lower plate electrode ranges from 0.1 MHz to 100 MHz and may be 13.56 MHz. A CCP system that may be used to perform the spacer etch process is schematically shown in FIG. 6. According to another embodiment, a remote plasma source capable of producing high radical to ion flux ratios may be used.

Figure 2A:
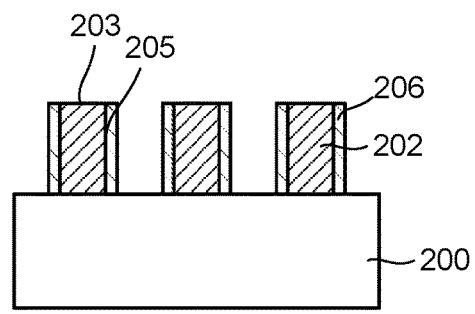
FIGS. 2A and 2B schematically show through cross-sectional views a method of processing a substrate according to an embodiment of the invention.
Figure 2B:
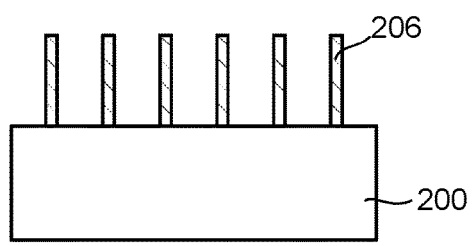

FIGS. 2A and 2B schematically show through cross-sectional views a method of processing a substrate according to an embodiment of the invention. FIG. 2A shows a substrate 200, SiN raised features 202 on the substrate 200, and sidewall spacers 206 formed on the vertical portions 205 of the SiN raised features 202. In this embodiment, the SiN raised features 202 are referred to as a first material, and the sidewall spacers 206 are referred to as a second material. The horizontal portions 203 of the SiN raised features 202 are exposed by a prior etch process. The substrate 200 and the sidewall spacers 206 may, for example, contain or consist of Si or $SiO_2$. In one example, the substrate 200 consists of Si and the sidewall spacers 206 consist of $SiO_2$. The SiN raised features 202 are sacrificial features and are often referred to as mandrels, and a subsequent removal of the SiN raised features 202 is often referred to as a mandrel pull. The structure shown in FIG. 2A may be formed by creating SiN raised features 202 using conventional deposition, lithography, and etch processes. Thereafter, the sidewall spacers 206 may be formed by depositing a conformal layer (not shown) on the exposed surfaces of the SiN raised features 202 and thereafter anisotropically removing the conformal layer from the horizontal portions 203 using an anisotropic etch process while leaving the layer on the vertical portions 205.

According to one embodiment, the SiN raised features 202 are removed from the substrate 200 in a dry etch process. The resulting structure with free-standing SiN sidewall spacers 206 on the substrate 200 are shown in FIG. 2B. According to an embodiment of the invention, the removal of the SiN raised features 202 from the substrate 200 includes plasma-exciting a non-polymerizing process gas containing $SF_6$ and optionally Ar, and exposing the substrate 200 to the plasma-excited process gas. In some examples, the non-polymerizing process gas contains or consists of $SF_6$ and Ar.

Figure 3A:
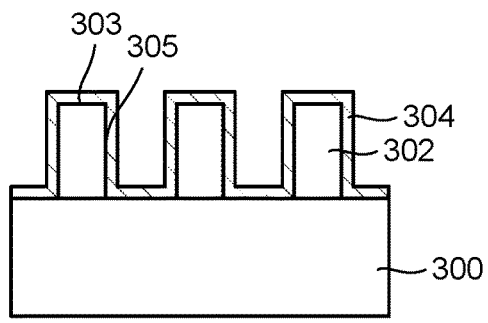
FIGS. 3A and 3B schematically show through cross-sectional views a method of processing a substrate according to an embodiment of the invention.
Figure 3B:
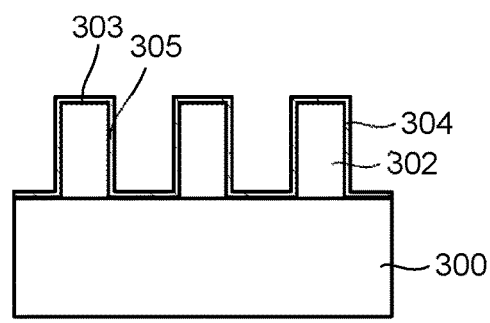

FIGS. 3A and 3B schematically show through cross-sectional views a method of processing a substrate according to an embodiment of the invention. FIG. 3A shows a substrate 300, raised features 302 on the substrate 300, and a SiN spacer layer 304 conformally formed on the exposed surfaces of the raised features 302 and the substrate 300. In this embodiment, the SiN spacer layer 304 is referred to as a first material, and the raised features 302 are referred to as a second material. The exposed surfaces of the raised features 302 include vertical portions 305 and horizontal portions 303. The substrate 300 and the raised features 302 can, for example, contain or consist of Si or $SiO_2$. In one example, the substrate 300 consists of Si and the raised features 302 consist of $SiO_2$. In some examples of microelectronic devices, the raised features 302 are referred to as fins.

According to an embodiment of the invention, structure in FIG. 3A is exposed to a plasma-excited non-polymerizing process gas containing $SF_6$ and optionally Ar. The resulting structure is shown in FIG. 3B where the SiN spacer layer 304 from FIG. 3A has been thinned in the isotropic etch process. In some examples, the non-polymerizing process gas contains or consists of $SF_6$ and Ar.

Figure 4A:
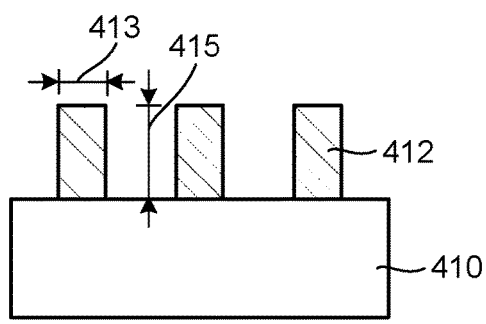
FIGS. 4A and 4B schematically show through cross-sectional views a method of processing a substrate according to an embodiment of the invention.
Figure 4B:
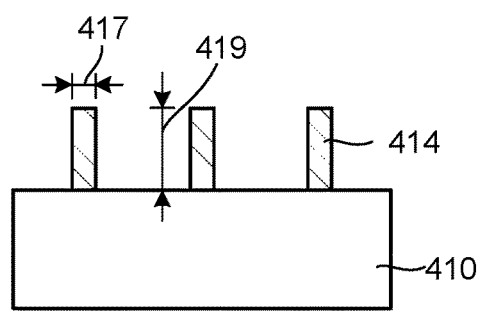

FIGS. 4A and 4B schematically show through cross-sectional views a method of processing a substrate according to an embodiment of the invention. FIG. 4A shows a substrate 410, and SiN raised features 412 on the substrate 410. In this embodiment, the SiN raised features 402 are referred to as a first material, and the substrate 410 is referred to as a second material. The SiN raised features 412 have a thickness 413 and a height 415 on the substrate 410. The substrate 410 can, for example, contain or consist of Si or $SiO_2$.

According to one embodiment, the SiN raised features 412 are trimmed in a dry etch process by plasma-exciting a non-polymerizing process gas containing $SF_6$ and optionally Ar, and exposing the substrate 410 to the plasma-excited process gas. The exposure forms trimmed SiN raised features 414 having a thickness 417 and a height 419, where the thickness 417 is less than the thickness 413, and the height 419 is less than the height 415. In one example, the non-polymerizing process gas contains or consists of $SF_6$ and Ar. The exposure to the plasma-excited process gas may be performed under isotropic processing conditions, for example by utilizing a remote plasma capable of producing high radical to ion flux ratios.

Referring back to FIG. 1A, a technique of conformally depositing the SiN spacer layer 104 may include a monolayer deposition ("MLD") method. The MLD method may include, for example, an ALD method, which is based on the principle of the formation of a saturated monolayer of reactive precursor molecules by chemisorption. A typical MLD process for forming an AB film, for example, consists of injecting a first precursor or reactant A ("$R_A$") for a period of time in which a saturated monolayer of A is formed on the substrate. Then, $R_A$ is purged from the chamber using an inert gas, $G_i$. A second precursor or reactant B ("$R_B$") is then injected into the chamber, also for a period of time, to combine B with A and form the layer AB on the substrate. $R_B$ is then purged from the chamber. This process of introducing precursors or reactants, purging the reactor, introducing another or the same precursors or reactants, and purging the reactor may be repeated a number of times to achieve an AB film of a desired thickness. The thickness of an AB film deposited in each ALD cycle may range from about 0.5 angstrom to about 2.5 angstrom.

In some embodiments, when forming an AB film, the MLD process may include injecting a precursor containing ABC, which is adsorbed on the substrate during the first step, and then removing C during the second step.

Figure 5:
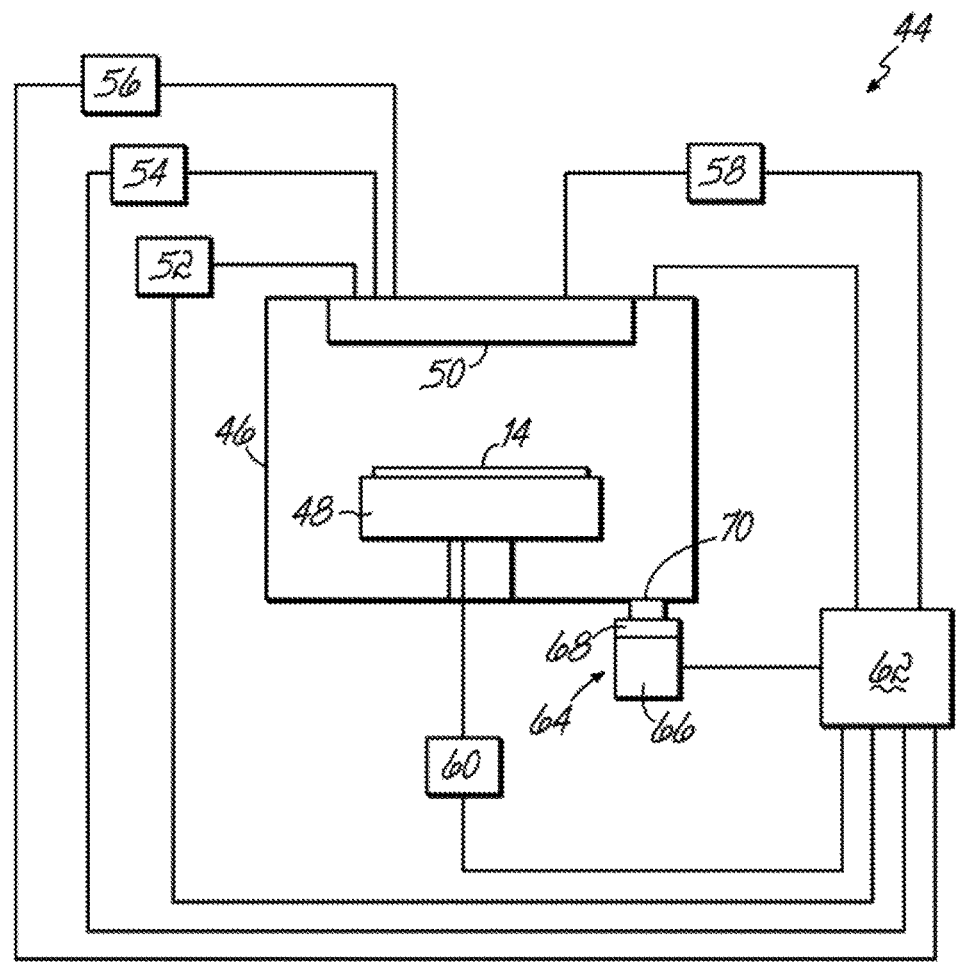
FIG. 5 schematically shows an atomic layer deposition (ALD) system according to an embodiment of the invention.

In accordance with one embodiment of the invention, the SiN spacer layer 104 may be deposited by an ALD deposition process in an ALD system, one example of which is shown as ALD system 44 in FIG. 5, which includes a process chamber 46 having a substrate holder 48 configured to support the substrate 14 thereon. The process chamber 46 further contains an upper assembly 50 (for example, a shower head) coupled to a first process material supply system 52 (which may provide a silicon-containing gas), a second process material supply system 54 (which may provide a nitrogen-containing gas), a purge gas supply system 56, and one or more auxiliary gas supply systems 58 (which may provide a dilution gas, or other gases as necessary for depositing the desired spacer layer material), and a substrate temperature control system 60.

A controller 62 may be coupled to one or more additional controllers/computers (not shown), which may obtain setup and/or configuration information from the additional controllers/computers. The controller 62 may be used to configure any number of the processing elements 52, 54, 56, 58, 60, and may collect, provide, process, store, and/or display data from the same. The controller 62 may comprise a number of applications for controlling one or more of the processing elements 52, 54, 56, 58, 60, and may, if desired, include a graphical user interface ("GUI," not shown) that may provide an easy to use interface for a user to monitor and/or control one or more of the processing elements 52, 54, 56, 58, 60.

The process chamber 46 is further coupled to a pressure control system 64, including a vacuum pumping system 66 and a valve 68, through a duct 70, wherein the pressure control system 64 is configured to controllably evacuate the process chamber 10 to a pressure suitable for forming the SiN spacer layer 104 and suitable for use of the first and second process materials. The vacuum pumping system 66 may include a turbo-molecular vacuum pump ("TMP") or a cryogenic pump that is capable of a pumping speed up to about 5000 liters per second (and greater) and the valve 68 may include a gate valve for throttling the chamber pressure. Moreover, a device (not shown) for monitoring the chamber process may be coupled to the processing chamber 46. The pressure control system 64 may, for example, be configured to control the process chamber pressure between about 0.1 Torr and about 100 Torr during an ALD process.

The first and second material supply systems 52, 54, the purge gas supply system 56, and each of the one or more auxiliary gas supply systems 58 may include one or more pressure control devices, one or more flow control devices, one or more filters, one or more valves, and/or one or more flow sensors. The flow control devices may include pneumatic driven valves, electro-mechanical (solenoidal) valves, and/or high-rate pulsed gas injection valves. According to embodiments of the invention, gases may be sequentially and alternately pulsed into the processing chamber 46, where the length of each gas pulse may, for example, be between about 0.1 second and about 100 seconds. Alternately, the length of each gas pulse may be between about 1 second and about 10 seconds. Exemplary gas pulse lengths for silicon- and nitrogen-containing gases may be between about 0.3 second and about 3 seconds, for example, about 1 second. Exemplary purge gas pulses may be between about 1 second and about 20 seconds, for example, about 3 seconds. Still referring to FIG. 5, the controller 62 may comprise a microprocessor, memory, and a digital I/O port capable of generating control voltages sufficient to communicate and activate inputs to the ALD system 44, as well as monitor outputs from the ALD system 44. Moreover, the controller 62 may be coupled to and may exchange information with the process chamber 46, the substrate holder 48, the upper assembly 50, the processing elements 52, 54, 56, 58, the substrate temperature controller 60, and the pressure control system 64. For example, a program stored in a memory of the controller 62 may be utilized to activate the inputs to the aforementioned components of the ALD system 44 according to a process recipe in order to perform a deposition process.

The controller 62 may be implemented as a general purpose computer system that performs a portion or all of the microprocessor-based processing steps of the present invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 62 includes at least one computer readable medium or memory, such as the controller memory, for holding instructions programmed according to the teachings of the invention and for containing data structures, tables, records, or other data that may be necessary to implement the present invention. Examples of computer readable media are hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 62, for driving a device or devices for implementing the present invention, and/or for enabling the controller 62 to interact with a human user. Such software may include, but is not limited to, device drivers, operating systems, development tools, and applications software. Such computer readable media further includes the computer program product of the present invention for performing all or a portion (if processing is distributed) of the processing performed in implementing the present invention.

The computer code devices may be any interpretable or executable code mechanism, including but not limited to scripts, interpretable programs, dynamic link libraries ("DLLs"), Java classes, and complete executable programs. Moreover, parts of the processing of the present invention may be distributed for better performance, reliability, and/or cost.

The term "computer readable medium" as used herein refers to any medium that participates in providing instructions to the processor of the controller 62 for execution. Thus, computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller 62 for execution. For example, the instructions may initially be carried on a magnetic disk of a remote computer. The remote computer can load the instructions for implementing all or a portion of the present invention remotely into a dynamic memory and send the instructions over a network to the controller 62.

The controller 62 may be locally located relative to the ALD system 44, or it may be remotely located relative to the ALD system 44. For example, the controller 62 may exchange data with the ALD system 44 using at least one of a direct connection, an intranet, the Internet and a wireless connection. The controller 62 may be coupled to an intranet at, for example, a customer site (i.e., a device maker, etc.), or it may be coupled to an intranet at, for example, a vendor site (i.e., an equipment manufacturer). Additionally, for example, the controller 62 may be coupled to the Internet. Furthermore, another computer (i.e., controller, server, etc.) may access, for example, the controller 62 to exchange data via at least one of a direct connection, an intranet, and the Internet. As also would be appreciated by those skilled in the art, the controller 62 may exchange data with the deposition system 44 via a wireless connection.

Deposition of the SiN spacer layer 104 may proceed by sequential and alternating pulse sequences to deposit the different components (here, for example, silicon and nitrogen) of the SiN spacer layer 104 material. Since ALD processes typically deposit less than a monolayer of the component per gas pulse, it is possible to form a homogenous material using separate deposition sequences of the different components of the film. Each gas pulse may include a respective purge or evacuation step to remove unreacted gas or byproducts from the process chamber 46. According to other embodiments of the present invention, one or more of the purge or evacuation steps may be omitted.

Therefore, and as one exemplary embodiment, the substrate 14 with the processed raised features 102 is disposed in the process chamber 46 of the ALD system 44 and sequentially exposed to a gas pulse containing silicon and a gas pulse of a nitrogen-containing gas, the latter of which may include $NH_3$, plasma-exited nitrogen (such as for use in PEALD systems), or a combination thereof, and optionally an inert gas, such as argon (Ar).

The silicon may react on the surface of the raised feature 102 to form a chemisorbed layer that is less than a monolayer thick. The nitrogen from the gas pulse of the nitrogen-containing gas may then react with the chemisorbed surface layer. By repeating this sequential gas exposure, i.e., by alternating the two exposures a plurality of times, it is possible to achieve layer-by-layer growth of about 1 angstrom ($10^{-10}$ meter) per cycle until a desired thickness is achieved.

Exemplary plasma processing device 500 depicted in FIG. 6 including a chamber 510, a substrate holder 520 (lower electrode), upon which a substrate 525 to be processed is affixed, a gas injection system 540, and a vacuum pumping system 550. Chamber 510 is configured to facilitate the generation of plasma in a processing region 545 adjacent a surface of substrate 525, wherein plasma is formed via collisions between heated electrons and an ionizable gas. An ionizable gas or mixture of gases is introduced via the gas injection system 540 and the process pressure is adjusted. For example, a gate valve (not shown) is used to throttle the vacuum pumping system 550. Desirably, plasma is utilized to create materials specific to a pre-determined materials process, and to aid either the deposition of material to a substrate 525 or the removal of material from the exposed surfaces of the substrate 525.

Substrate 525 is transferred into and out of chamber 510 through a slot valve (not shown) and chamber feed-through (not shown) via robotic substrate transfer system where it is received by substrate lift pins (not shown) housed within substrate holder 520 and mechanically translated by devices housed therein. Once the substrate 525 is received from the substrate transfer system, it is lowered to an upper surface of the substrate holder 520.

In an alternate embodiment, the substrate 525 is affixed to the substrate holder 520 via an electrostatic clamp (not shown). Furthermore, the substrate holder 520 further includes a cooling system including a re-circulating coolant flow that receives heat from the substrate holder 520 and transfers heat to a heat exchanger system (not shown), or when heating, transfers heat from the heat exchanger system. Moreover, gas may be delivered to the back-side of the substrate to improve the gas-gap thermal conductance between the substrate 525 and the substrate holder 520. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 525 from the plasma and the heat flux removed from substrate 525 by conduction to the substrate holder 520. In other embodiments, heating elements, such as resistive heating elements, or thermo-electric heaters/coolers are included.

In a first embodiment, the substrate holder 520 further serves as an electrode through which radio frequency (RF) power is coupled to plasma in the processing region 545. For example, the substrate holder 520 is electrically biased at a RF voltage via the transmission of RF power from an RF generator 530 through an impedance match network 532 to the substrate holder 520. The RF bias serves to heat electrons and, thereby, form and maintain plasma. In this configuration, the system operates as a reactive ion etch (RIE) reactor, wherein the chamber and upper gas injection electrode serve as ground surfaces. A typical frequency for the RF bias ranges from 0.1 MHz to 100 MHz and may be 13.56 MHz. In an alternate embodiment, RF power is applied to the substrate holder electrode at multiple frequencies. Furthermore, the impedance match network 532 serves to maximize the transfer of RF power to plasma in processing chamber 10 by minimizing the reflected power. Match network topologies (e.g. L-type, π-type, T-type, etc.) and automatic control methods are known in the art.

Figure 7:
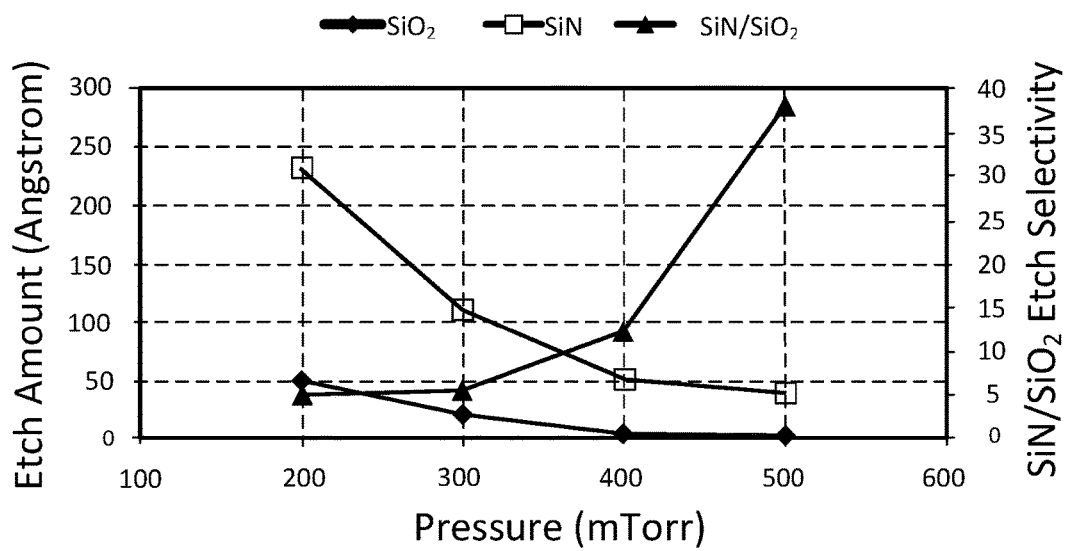
FIG. 7 shows SiN etch amount, $SiO_2$ etch amount, and $SiN/SiO_2$ etch selectivity as a function of plasma process chamber gas pressure according to an embodiment of the invention.

With continuing reference to FIG. 7, a process gas 542 (e.g., containing $SF_6$ and optionally Ar) is introduced to the processing region 545 through the gas injection system 540. Gas injection system 540 can include a showerhead, wherein the process gas 542 is supplied from a gas delivery system (not shown) to the processing region 545 through a gas injection plenum (not shown), a series of baffle plates (not shown) and a multi-orifice showerhead gas injection plate (not shown).

Vacuum pump system 550 preferably includes a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is employed. TMPs are useful for low pressure processing, typically less than 50 mTorr. At higher pressures, the TMP pumping speed falls off dramatically. For high pressure processing (i.e. greater than 100 mTorr), a mechanical booster pump and dry roughing pump are used.

A computer 555 includes a microprocessor, a memory, and a digital I/O port capable of generating control voltages sufficient to communicate and activate inputs to the plasma processing system 500 as well as monitor outputs from the plasma processing system 500. Moreover, the computer 555 is coupled to and exchanges information with the RF generator 530, the impedance match network 532, the gas injection system 540 and the vacuum pump system 550. A program stored in the memory is utilized to activate the inputs to the aforementioned components of a plasma processing system 500 according to a stored process recipe.

The plasma processing system 500 further includes an upper plate electrode 570 to which RF power may be coupled from an RF generator 572 through an impedance match network 574. A typical frequency for the application of RF power to the upper electrode ranges from 10 MHz to 200 MHz and is preferably 60 MHz. Additionally, a typical frequency for the application of power to the lower electrode ranges from 0.1 MHz to 30 MHz. Moreover, the computer 555 is coupled to the RF generator 572 and the impedance match network 574 in order to control the application of RF power to the upper electrode 570. According to some embodiments, plasma may be generated in the process chamber 510 by RF-powering the lower electrode 520 while the upper electrode 570 may be grounded or not powered.

The dry etch of SiN layers using a non-polymerizing process gas containing $SF_6$ and optionally Ar, is thought to include the following etch mechanism that includes generation of F radicals in a plasma, diffusion of F radicals to the $Si_3N_4$ layer, adsorption of F radicals on the SiN layer, surface reaction of F with SiN to form $SiF_4$ etch products, and desorption and removal of the $SiF_4$ etch products from the SiN layer.

FIG. 7 shows SiN etch amount, $SiO_2$ etch amount, and $SiN/SiO_2$ etch selectivity as a function of plasma process chamber gas pressure according to an embodiment of the invention. The process gas consisted of $SF_6$ gas and Ar gas that was plasma-excited using a CCP plasma source. The processing conditions included 0W applied to an upper plate electrode, 100 W of RF power at 13.56 MHz applied to a lower plate electrode supporting the substrate, $SF_6$ gas flow of 450 sccm and Ar gas flow of 1000 sccm, and plasma exposure time of 300 seconds. The lower plate electrode (substrate holder) was cooled at 15° C. The gas pressures in the plasma process chamber were 200 mTorr, 300 mTorr, 400 mTorr, and 500 mTorr. The experimental results show that $SiN/SiO_2$ etch selectivity greatly increased at gas pressure above 300 mTorr, increasing from about 5 at 300 mTorr to greater than 38 at 500 mTorr. This unexpectedly high $SiN/SiO_2$ etch selectivity at gas pressure above 300 mTorr corresponds to substantially infinite $SiN/SiO_2$ etch selectivity for semiconductor manufacturing. Thus, according to one embodiment, a $SiN/SiO_2$ etch selectivity greater than 30 may easily be achieved.

It is contemplated that this unexpectedly high $SiN/SiO_2$ etch selectivity as the gas pressure is increased is at least in part due to decrease in ion energy in the plasma, accompanied by an increase in radical flux and a reduction in ion flux exposed to the substrate. Further, the low RF power (<100 W) applied to the lower plate electrode is below the sputtering threshold of the first and second materials by ions in the plasma-excited process gas. In other words, the ions that are created in the plasma-excited process gas do not have enough kinetic energy to sputter etch the first and second materials. Therefore, the high $SiN/SiO_2$ etch selectivity is believed to be entirely due to thermodynamically favored radical etch of SiN relative to $SiO_2$.

According to one embodiment, a plasma-excited process gas may be generated using a capacitively coupled plasma (CCP) source containing an upper plate electrode, and a lower plate electrode supporting the substrate, where the upper plate electrode is grounded and RF power applied to the lower plate electrode creates ions in the plasma having kinetic energy below the sputtering threshold of the first and second materials. In one example, RF power of about 100 W, or less (e.g., <80 W, <60 W, <40 W, etc), may be applied to a lower plate electrode of a CCP system. A frequency of the RF power applied to the lower plate electrode may be 13.56 MHz. According to some embodiments the $SF_6$ gas flow can be between about 50 sccm and about 500 sccm, and the Ar gas flow can be between about 0 sccm and about 1000 sccm.

A plurality of embodiments for substrate processing methods using non-polymerizing chemistry to preferentially etch silicon nitride relative to other materials used in semiconductor manufacturing have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A substrate processing method, comprising:
   providing in a plasma processing chamber a substrate containing a first material containing SiN and a second material that is different from the first material;
   forming a plasma-excited process gas containing $SF_6$, wherein forming the plasma-excited process gas includes generating a plasma using a capacitively coupled plasma source containing an upper plate electrode and a lower plate electrode supporting the substrate, and wherein the upper plate electrode is grounded or not powered and radio frequency (RF) power is applied to the lower plate electrode to generate the plasma in a processing region between the upper plate electrode and the lower plate electrode; and
   exposing the substrate to the plasma-excited process gas to preferentially etch the first material relative to the second material, wherein the exposing includes exposing the substrate to ions having kinetic energy that is below a sputtering threshold of the first and second materials, and wherein the kinetic energy of the ions is supplied by the RF power applied to the lower plate electrode.

2. The method of claim 1, wherein the second material is selected from the group consisting of Si and $SiO_2$.

3. The method of claim 1, wherein the second material includes $SiO_2$ and a $SiN/SiO_2$ etch selectivity is greater than 30.

4. The method of claim 1, wherein, during the exposing, a gas pressure greater than about 300 mTorr is maintained in the plasma processing chamber.

5. The method of claim 1, wherein, during the exposing, a gas pressure of about 500 mTorr, or greater, is maintained in the plasma processing chamber.

6. The method of claim 1, wherein the RF power applied to the lower plate electrode is about 100 W, or less.

7. The method of claim 1, wherein a frequency of the RF power applied to the lower plate electrode is 13.56 MHz.

8. The method of claim 1, wherein the plasma-excited process gas further contains Ar.

9. The method of claim 1, wherein the plasma-excited process gas consists of $SF_6$ and Ar.

10. The method of claim 1, wherein the second material includes raised features on the substrate, the first material forms sidewall spacers on vertical portions of the raised features, and the exposing removes the sidewall spacers from the raised features.

11. The method of claim 1, wherein the first material includes raised features on the substrate, the second material forms sidewall spacers on vertical portions of the raised features, and the exposing removes the raised features but not the sidewall spacers.

12. The method of claim 1, wherein the second material includes raised features on the substrate, the first material forms a conformal film on the raised features, and the exposing isotropically thins the conformal film.

13. A substrate processing method, comprising:
providing in a plasma processing chamber a substrate containing a first material containing SiN and a second material containing $SiO_2$;
forming a plasma-excited process gas containing $SF_6$ and Ar, wherein forming the plasma-excited process gas includes generating a plasma using a capacitively coupled plasma source containing an upper plate electrode and a lower plate electrode supporting the substrate, and wherein the upper plate electrode is grounded or not powered and radio frequency (RF) power is applied to the lower plate electrode; and
exposing the substrate to the plasma-excited process gas to preferentially etch the first material relative to the second material with a $SiN/SiO_2$ etch selectivity greater than 30, wherein the exposing includes exposing the substrate to ions with kinetic energy that is below a sputtering threshold of the first and second materials, and wherein the kinetic energy of the ions is supplied by the RF power applied to the lower plate electrode.

14. The method of claim 13, wherein, during the exposing, a gas pressure of about 500 mTorr, or greater, is maintained in the plasma processing chamber.

* * * * *